United States Patent [19]

Bogner

[11] 4,414,425
[45] Nov. 8, 1983

[54] BROADBAND NON-CONTACTING RF SHIELDING GASKET

[75] Inventor: Bruce F. Bogner, Mt. Holly, N.J.

[73] Assignee: RCA Corporation, New York, N.Y.

[21] Appl. No.: 306,355

[22] Filed: Sep. 28, 1981

[51] Int. Cl.³ ............................................. H05K 9/00
[52] U.S. Cl. ............................. 174/35 GC; 333/204; 361/424; 455/300
[58] Field of Search ................. 333/12, 204, 238, 246; 334/85; 361/1, 119, 424; 455/300, 301; 174/35 GC; 219/10.55 D

[56] References Cited

U.S. PATENT DOCUMENTS

| | | | |
|---|---|---|---|
| 2,322,971 | 6/1943 | Roosenstein | 333/12 |
| 3,329,898 | 7/1967 | Tuck et al. | 333/238 |
| 3,519,962 | 7/1970 | Lind | 333/12 |
| 3,605,045 | 9/1971 | Ramsbotham, Jr. | 333/204 |
| 3,651,300 | 3/1972 | Haagensen | 219/10.55 D |
| 3,879,690 | 4/1975 | Golant et al. | 333/204 |
| 3,885,118 | 5/1975 | Valtersson | 219/10.55 D X |

FOREIGN PATENT DOCUMENTS 554570  3/1958  Canada ................................. 334/85

*Primary Examiner*—Paul L. Gensler
*Attorney, Agent, or Firm*—Eugene M. Whitacre; Joseph S. Tripoli; William H. Meise

[57] ABSTRACT

An RF gasket for reducing the flow of energy in the interface area between two conductive surfaces includes a plurality of stub pairs. These stub-pairs are dimensioned to form sub-groups of low impedance paths between the two conductive surfaces with each sub-group being effective in a different frequency sub-band of a large frequency range. The low impedance paths are established without the use of direct current connections between the two conductive surfaces. Such a gasket provides a broadband, non-contacting RF shield in the interface area between the two conductive surfaces.

12 Claims, 7 Drawing Figures

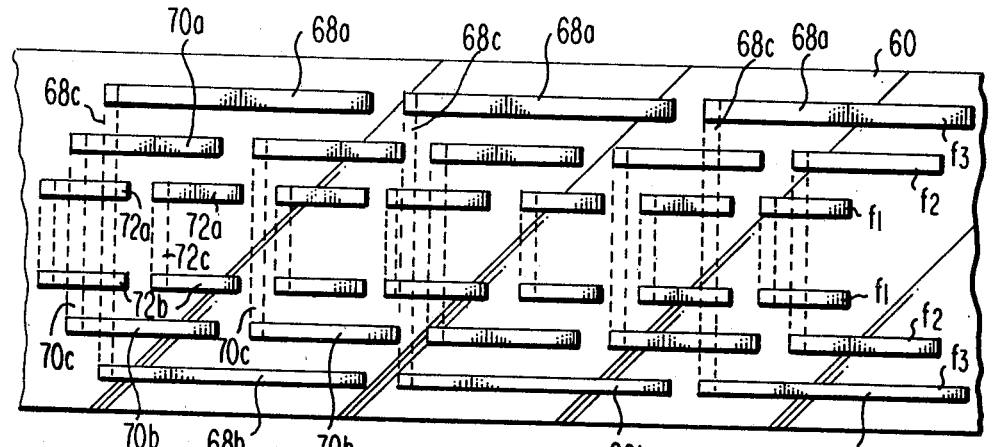
Fig. 3
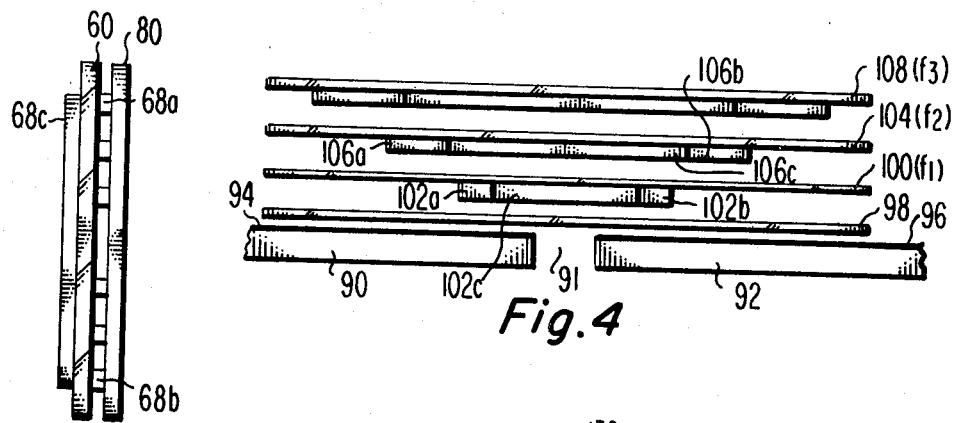
Fig. 3a
Fig. 4
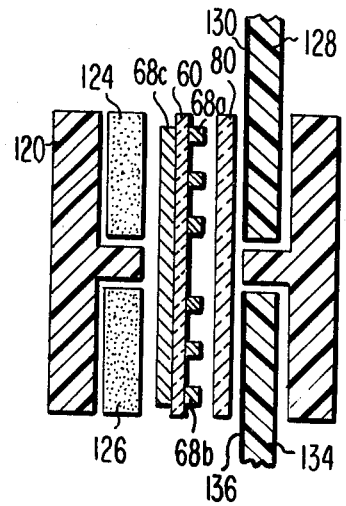
Fig. 5

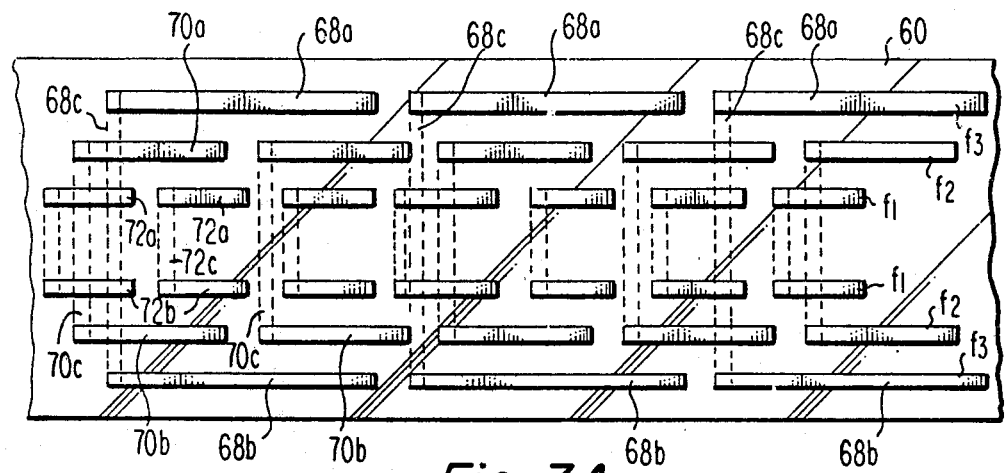
Fig. 3A
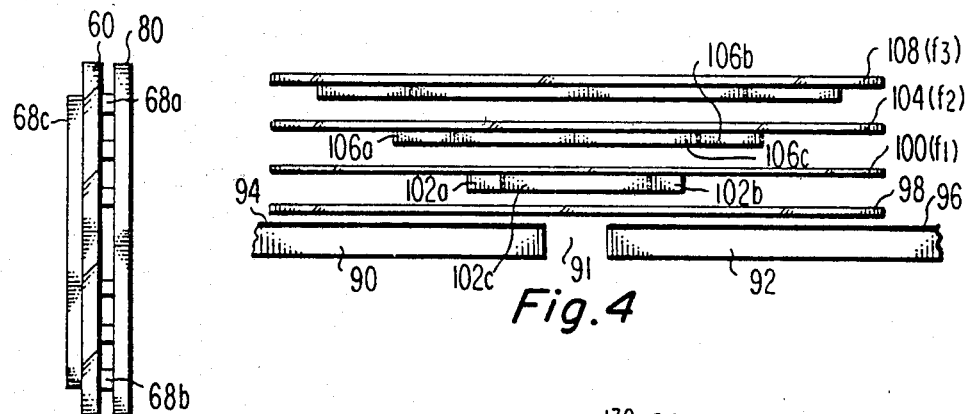
Fig. 3B
Fig. 4
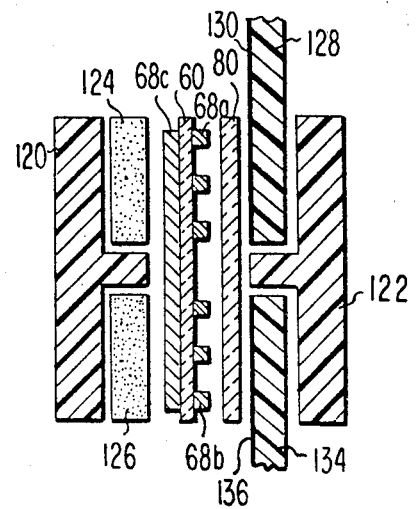
Fig. 5

BROADBAND NON-CONTACTING RF SHIELDING GASKET

The present invention relates generally to RF shielding apparatus and more particularly to a device for providing improved shielding at the interface area between two conductive surfaces without direct electrical contact therebetween.

There are many applications where it is desirable to provide RF shielding either to prevent RF radiation from leaking out, or, by the principle of reciprocity, to prevent interference from external RF radiation. Examples of such applications are radio receivers, microwave ovens, X-ray equipment and certain types of video disc players. In describing the preferred embodiment for practicing the present invention, a video disc player will be used as the example, but, it will be understood that the principles and advantages of the present invention will be applicable to a number of other devices.

In the pickup circuitry for certain capacitive type video disc systems, such as described in U.S. Pat. No. 3,842,194 issued to Clemens, an oscillator is used to drive a tuned circuit, one component of which is the variable capacitance formed between an electrode on a stylus and a conductive property of the playback disc. This oscillator provides a signal at 915 MHz. An example of such pickup circuitry may be found with reference to U.S. Pat. No. 4,080,625 issued to Kawamoto. In the United States this frequency is within the ISM (Industrial, Scientific, Medical) band which has been designated for such equipment. There are standards set for the amount of RF radiation allowed from such equipment to insure that other devices in the area do not experience interference from RF signals generated in the given equipment.

In other countries of the world, notably in Europe, designated frequency bands for certain classes of equipment may not exist. Therefore, to cope with potential RF interference, these countries simply set very stringent requirements for the maximum allowable RF radiation from devices such as video disc players. Thus the problem arises as to the manner in which these stringent requirements can be met.

It is well known in the art that RF radiation can be substantially reduced by enclosing equipment with the potential for radiation (or, by reciprocity, the susceptibility to RF interference) in a conductive enclosure. In the case of a video disc player this may be accomplished by providing an inner metal box surrounded by a decorative outer shell, or, by coating the inside surfaces of the decorative shell with a conductive material.

Despite such an approach, a problem still exists in trying to meet stringent RF radiation standards. The video disc player shell is typically manufactured in two parts, an upper part and a lower part. In addition, a cover or lid is provided in the upper part to provide access to a carriage which houses a replaceable stylus cartridge. It has been found that even with the use of inner metal boxes or conductive inner surfaces, RF leakage still occurs at the seam separating the upper and lower parts as well as the seam around the cartridge access cover in the upper part.

It is known in the art that leakage (or susceptibility) at such seams can be reduced by providing direct electrically conductive contact between the two conductive surfaces. Typically, this can be achieved through the use of conductive fingers which are often spring loaded to provide good electrical contact. An example of such an arrangement may be found in U.S. Pat. No. 2,317,813 issued to Schoenborn. Another approach toward sealing off RF radiation at seams may be found in U.S. Pat. No. 2,604,507 issued to Tyson where a metal gasket having pointed edges is used at a seam. In both cases, a reasonable amount of force must be used on the surfaces to be RF shielded to be sure that good electrical contact is obtained.

The problem with such arrangements is that they are costly, very often involve dissimilar metals which can lead to corrosion and the force required to give good contact often results in deformation of the apparatus providing the RF seal. Spring fingers may be bent and metal gaskets may lose their desired shape after repeated assembly and disassembly of the equipment. In addition, consumer access to inner conductive surfaces represents a potential shock hazard.

In a U. S. patent application Ser. No. 279,181 filed June 30, 1981 for O. M. Woodward an invention is disclosed for reducing RF energy flow at the interface area of two conductive surfaces without a direct electrical contact therebetween. The apparatus for accomplishing this result as taught by Woodward comprises a plurality of elongated conductive stub-like members located in the interface area between the two surfaces. One end of each of the stubs is connected to a conductive member. The other end of each stub forms an open circuit. A means is provided for spacing at least a portion of one of the conductive surfaces in parallel relationship to the stubs. The stubs and the portion of one of the conductive surfaces form a plurality of microstrip lines. The stubs are dimensioned such that the open circuits are transformed or reflected back at the other end of the stub as a low impedance path in the frequency range of interest. The low impedance paths are then formed between the stubs and the portion of one of the conductive surfaces. A means is provided for coupling the conductive member to the other conductive surface. In this manner a plurality of low impedance paths, in the frequency range of interest, are formed in the interface area between the two conductive surfaces. The "slots" formed by the adjacent low impedance paths along the seam are much smaller than a quarter wavelength at the frequency of interest and thus exhibit a very low radiation characteristic.

In a U.S. patent application Ser. No. 279,188 filed June 30, 1981 for B. F. Bogner now U.S. Pat. No. 4,396,795 an improvement over the Woodward approach is described. The Bogner case provides an RF gasket having the stub-like members in a folded configuration. As a result of folding these stub-like members it was possible to increase the packing density of the low impedance paths. Thus, as a direct result of this improvement it was possible to increase the number of low impedance paths along a seam and therefore greatly shorten the length of the "slots" created which ultimately resulted in improved attenuation of energy in the frequency range of interest which would otherwise propagate through the seams or interface area between the two conductive surfaces.

An RF gasket using the folded stubs has shown good attenuation characteristics in the range of 902 MHz to 929 MHz. This bandwidth is adequate for use as described above.

However, recently there have been proposals to set permissible radiation levels at very low numbers across an extremely broadband such as 30 MHz to 1,000 MHz for equipment like computer terminals, computer devices, electronic games, personal computers, calculators and other devices such as video disc players.

The non-contacting RF gaskets described by Woodward and Bogner will not adequately provide attenuation of RF signals across such a large frequency band (i.e., 30 MHz–1,000 MHz). Although contacting type gaskets will cover this broad frquency range, the problems previously mentioned with respect to contacting gaskets would still be present. Again, corrosion between contacting metal surfaces is a problem with metallic contacting type gaskets. The so-called non-metallic contacting gaskets which usually comprise metal particles or mesh structure embedded in a rubber or plastic, require a substantial degree of applied pressure to be effective. In many consumer devices the walls of the cabinet enclosures are made to be thin for aesthetic reasons and distortion of the walls could occur if excessive pressure is applied between the two halves of a cabinet in order to seal off the interface area between the halves for RF shielding purposes.

Thus, there is a need for a broadband RF gasket which is preferably of the non-contacting type.

The present invention is directed to an improvement over the Woodward and Bogner inventions in order to provide a broadband solution to the above-described problem. Basically, the present invention takes a broadband of frequencies, such as 30 MHz–1,000 MHz and breaks it down into smaller sub-bands of frequency. Each band is then addressed by a non-contacting RF gasket using the basic teaching of Woodward and Bogner. An important feature of the present invention is the manner in which all of these sub-bands can be covered in a relatively small space and not have the corresponding gasket elements interfere with each other.

In accordance with the present invention there is provided an RF gasket for electrically shielding the interface area between two conductive surfaces. The gasket is effective to reduce the flow of energy through the interface area across a given band of frequencies. The gasket comprises a plurality of stub pairs. Each stub pair comprises a first elongated conductive stub-like member and a second elongated conductive stub-like member and a means is provided for electrically joining one end of the first stub-like member to one end of the corresponding second stub-like member. A means is provided for positioning the first stub-like member of each stub pair in a spaced and substantially parallel relationship with respect to one of the conductive surfaces and for similarly positioning the second stub-like member of each stub-pair with respect to the other conductive surface. The stub pairs are dimensioned to fall in sub-groups corresponding to sub-bands of the given frequency band. Each stub-like member in each stub pair forms an open circuit at the other end thereof and is dimensioned such that each open circuit is transformed into a low impedance path in a sub-band of the given frequency band. These low impedance paths occur between the one end of each stub-like member and the corresponding adjacent conductive surface. Each stub-pair then provides an effective low impedance path between the two conductive surfaces in one corresponding sub-band of a plurality of sub-bands in the given frequency band.

In the drawings:

FIGS. 3A–3B illustrate one embodiment of an RF gasket in accordance with the present invention;

FIG. 4 illustrates another embodiment of an RF gasket in accordance with the present invention;

FIG. 5 illustrates the embodiment of FIGS. 3A–3B in an H configuration; and

Figure 1:
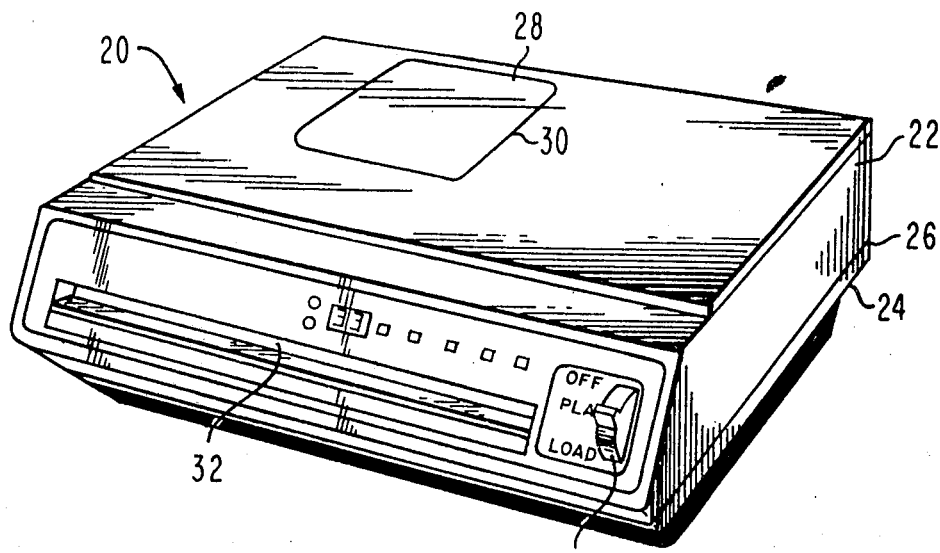
FIG. 1 is a perspective view of a video disc player which can utilize the apparatus of the present invention.

Referring now to FIG. 1, video disc player 20 comprises an upper portion 22 and a lower portion 24. The inner surfaces of both the upper and lower portions of the player are coated with a material having conductive particles so as to create a substantially enclosed conductive housing for the player electronics which includes an oscillator providing a signal at 915 MHz. The upper and lower portions 22 and 24 are joined at the seam 26 which goes all the way around the player. In the alternative, there can be a conductive box inside of the decorative shell of player 20 which would have corresponding seams and openings.

Also shown in FIG. 1 is the cartridge access cover or lid 28. When cover 28 is raised or removed, a carriage is exposed which carries the replaceable stylus cartridge. In a player where there is concern about RF radiation, the cover 28 has at least its inner surface made conductive as by the use of conductive paint. The seam 30 represents the interface between the top of portion 22 and the cover 28.

The player 20 also includes an opening 32 which is provided so that a caddy enclosing record may be inserted into the player to load a record. When the record is loaded and the function lever 34 is moved from the load position to the play position, a door (not shown) inside of the player is moved to close off the opening 32. It is desirable to provide some shielding apparatus in addition to the door in the area of opening 32.

The player 20 in FIG. 1 is merely illustrative of a device which can profit from the use of the present invention. The aim of the present invention is to provide a very broadband, non-contacting RF gasket for any one of a number of devices in order to reduce RF radiation (or susceptibility) at interface areas or seams across a very wide band of frequencies.

Figure 2:
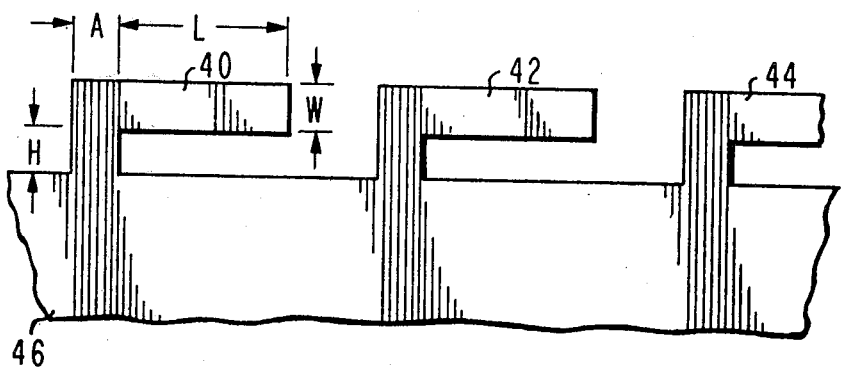
FIG. 2 is an example of conductive stub-like members as taught by Woodward for background information purposes.

FIG. 2 is illustrative of the work of Woodward and is presented for purposes of background information. In FIG. 2, a series of stubs 40, 42, 44 are shown. Each stub is made from a thin copper conductor and the dimensions of A, H and W are each about one-eighth of an inch and dimension L is about two inches. One end of each of the stub elements is connected to a common conductive member 46, while the other end of each stub is open circuited. Consider now another conductive surface lying in a plane parallel to the conductive member 46 and stubs 40, 42 and 44. Further consider a dielectric such as polystyrene about one-eighth of an inch thick separating the structure of FIG. 2 from the parallel conductive surface. Such a composite structure may be thought of as a plurality of microstrip lines with the other conductive surface forming the ground plane. If the length L is selected such that it is approximately a quarter wavelength at 915 MHz taking into consideration the dielectric constant of the separator, then the open circuit at the far end of each stub will be transformed or reflected back at the near end as a short circuit between the stub and the other conductive surface at a particular frequency and indeed will be a relatively low impedance path across a band of frequencies centered about 915 MHz.

Thus, as demonstrated by Woodward, the structure of FIG. 2 when combined with a ground plane and dielectric separator will form a plurality of low impedance paths between the near end of the stub and the ground plane in the frequency band of interest.

In the previously mentioned Bogner application it was demonstrated that the stubs 40, 42 and 44 could be folded back on themselves to conserve space and that the common conductive member 46 could be replaced with individual conductive members joining one stub-like member to a corresponding stub-like member in a second plurality. In addition, by making the stub dimensions small as well, Bogner showed how the packing density of the stubs could be increased, and, as a result the bandwidths of operation of the gasket was increased and made effective over a band such as 900–930 MHz.

With the above as background material, an RF gasket in accordance with the present invention is shown in FIG. 3A–3B. In FIG. 3A, which is a plan view, a strip of dielectric material such as Mylar (polyethylene terephthalate strip 60 has a configuration of elongated recurring copper stub-like members. Mylar strip 60 has a first plurality of elongated conductive stub-like members 68a and a second plurality of corresponding elongated conductive stub-like members 68b made from copper strips printed, etched or otherwise formed along the elongated dimension on the upper surface of Mylar strip 60. Also on the upper surface there is a first plurality of copper strips 70a and a corresponding second plurality 70b. Strips 72a and 72b are similarly arranged on strip 60.

Also located on Mylar strip 60 are three pluralities of jumpers 68c, 70c and 72c formed from copper strips which are printed, etched, or otherwise formed on the bottom surface of Mylar strip 60. At the junctions of the top surface strips and the jumper strips, such as the overlap of 68a–68c, 70a–70c, 72a–72c, etc., there is a direct electrical connection formed. Thus, from a DC point of view, 68a is connected to 68b via jumper 68c. The same is true for the other stub-pairs 70a, 70b and 72a, 72b via jumpers 70c and 72c, respectively.

In the side view shown in FIGS. 3A, 3B only the stubpair 68a, 68b and jumper 68c are specifically designated for purposes of illustration. Also shown in FIG. 3B is another Mylar 80 which is placed up against the stub-like elements such as 68a and 68b and serves as a dielectric spacer. The function of strip 80 will be discussed in greater detail herein.

For a general understanding of the invention described thus far, assume that first and second conductive surfaces are placed on top of the arrangement of FIG. 3A with the seam between the two surfaces running along the elongated center line of the FIG. 3A arrangement.

Without the RF gasket, it would be possible to have RF energy pass through the interface area between the conductive surfaces (such as the seam 26 in FIG. 1) because the elongated dimension of the seam will support the propagation of RF energy through the interface area.

With the RF gasket of FIG. 3B spaced from and substantially parallel to the conductive surfaces by virtue of the Mylar strip 80, and with the dimensions of stub-pair 68a, 68b selected to be about a quarter wavelength at a frequency f3, then the open circuit at the far end of 68a is reflected back as a relatively low impedance at frequency f3 between the upper conductive surface and the junction of 68a and 68c. Similarly, the open circuit at the far end of 68b is reflected back as a low impedance at frequency f3, between the lower conductive surface and the junction of 68b and 68c. Thus, at frequency f3 there is a low impedance path formed from the upper conductive surface to the lower conductive surface without direct electrical contact between the two surfaces.

In a similar manner stub-pair 70a, 70b will provide a low impedance path between the two conductive surfaces at frequency f2, which is higher than frequency f3. F2 is the frequency where the elongated dimension of stubs 70a and 70b is about a quarter wavelength.

The same analysis is applied to stub-pair 72a, 72b for a frequency of f1 which is higher than frequency f2.

In the example of FIGS. 3A–3B, a given frequency band is broken up into three smaller sub-bands with respective center frequencies f3, f2, and f1. Thus, at frequency f1 there will be a plurality of low impedance paths across the interface area of the two conductive surfaces by virtue of the plurality of stub pairs formed by 72a, 72b and 72c and by breaking up the elongated dimension of the seam with short circuits or low impedance paths, the flow of energy through the interface area at frequency f1 is reduced. Similarly, the flow of energy at frequency f2 is reduced by virtue of the plurality of low impedance paths at frequency f2 created by stub-pairs 70a, 70b and 70c. The same is true at frequency f3 as a result of stub pairs 68a, 68b and 68c.

Although the stub-pairs are tuned to particular frequencies, they are effective over a bandwidth of, for example, 10 percent. Therefore, it is possible to take a given frequency band and to divide that band into smaller sub-bands and provide the aforementioned low impedance paths in each of the sub-bands so that the given frequency band is covered. The number of sub-bands is limited primarily by space considerations. That is, it is a question of space configuration as to how many stub-pairs can be placed on Mylar strip 60 in FIG. 3A.

FIG. 4 shows a second embodiment of the present invention wherein items 90 and 92 may be thought of as the walls of a cabinet which come together in the interface area 91 to form a seam. The inner surfaces of walls 90 and 92 are coated with a conductive material to form conductive surfaces 94 and 96. A Mylar spacer strip 98 is used to space the RF gasket from the surfaces 94 and 96 in a substantially parallel configuration. A first Mylar strip 100 is then placed next to strip 98 and includes stub-pairs 102a, 102b joined at one end by jumper 102c. This stub-pair is tuned to provide a low impedance path from 96 to 94 at frequency f1.

The next Mylar strip 104 has stub-pairs 106a, 106b joined at one end by jumper 106c. This strip is tuned to provide a low impedance path from 96 to 94 at frequency f2. Strip 108 has a stub-pair tuned to a center frequency of f3.

Looking along a line going into the drawing there are repetitions of these stub-pairs going down the elongated dimension of the interface area so that the above-described low impedance paths in the sub-bands are repeated over the length of the seam between the two conductive surfaces 94 and 96.

A point to be noted in respect of the configuration shown in FIG. 4 is that as the stub-pairs are spaced further away from the ground planes (surfaces 96 and 94) the width of the copper conductors forming the stub-pairs is increased. This is done to preserve the ratio of width of stub conductor to height above the ground plane in order to maintain broadband coverage.

The embodiment of FIG. 4 uses several copper clad Mylar strips but does not require interconnections from the top surface to the bottom surface of the Mylar as in the previously-described embodiment.

FIG. 5 shows a compact RF gasket using the previously-described embodiment shown in FIGS. 3A-3B. Here two halves 120 and 122 of an H-shaped holder are shown which may be formed from a plastic material. This is a cross-sectional view and the two halves may be tought of as extending into the drawing in the elongated dimension. Two foam rubber strips 124 and 126 are placed in the left hand upper and lower portions of member 120. The assembly including items 60, 80, 68a, 68b and 68c are positioned next to items 120, 124 and 126. The right half 122 of the H strip is then brought into position.

The upper wall 128 having a conductive inner surface 130 is brought into the upper portion of the right half 122 of the H strip and the lower wall 134 having conductive inner surface 136 is brought into the area of the lower portion of the right half 122 of the H strip.

Thus, a compact RF gasket is provided which will provide recurring low impedance paths between surfaces 130 and 136 without direct contact therebetween and across a large band of frequencies.

Again, the number of sub-bands can be very great in number depending upon spatial constraints.

Figure 6:
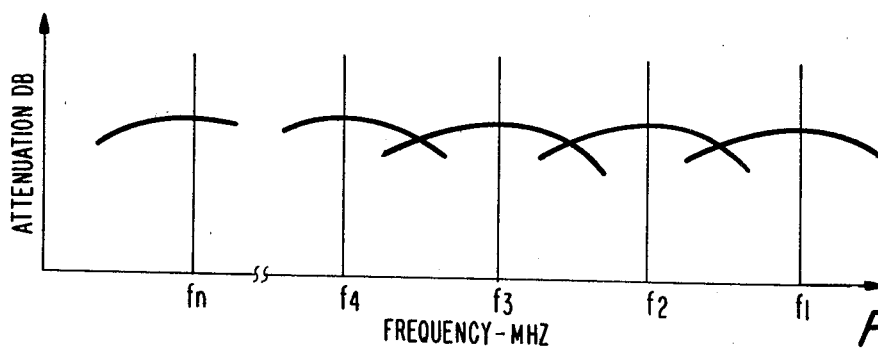
FIG. 6 is a graph illustrating the broadband effectiveness of RF gaskets in accordance with the present invention.

FIG. 6 shows graphically how the large band is covered through the use of the present invention. The repetitive stub-pairs of the gasket having the shortest length handles the sub-band centered at the high frequency f1 to attenuate energy in that sub-band which might otherwise propagate through the seam between the two conductive surfaces. Similarly, another plurality of stub-pairs running along the seam handles the sub-band centered at f2. By the judicious selection of parameters, n sub-bands can be covered and if these sub-bands are made to overlap then the attenuation of energy across the entire given band (such as 30 MHz to 1,000 MHz) can be made to be substantially constant (within a few db) and relatively high (on the order of 30 db).

The present invention describes a means for achieving extremely broadband attenuation or shielding from RF radiation or susceptibility for a great number of different applications without using the direct contact type arrangements. While the present invention was illustrated with cabinet walls having conductive coatings, it will be clearly understood that the invention is equally applicable to closing off a seam formed by two portions of a metal box where it is desired to have a broadband, non-contacting RF gasket.

What is claimed is:

1. An RF gasket for providing electrical shielding in the interface area between two conductive surfaces without direct electrical contact between the two surfaces, said gasket being effective to substantially reduce the flow of energy in a given frequency band, through said interface area, said gasket comprising:
a plurality of stub-pairs, each stub-pair comprising: a first elongated conductive stub-like member; a second elongated stub-like member; and means for electrically joining one end of said first stub-like member to one end of said second stub-like member;
means for positioning said plurality of stub-pairs such that said first stub-like member in each pair is spaced and substantially parallel to one of said conductive surfaces and said second stub-like member is spaced and substantially parallel to the other of said conductive surfaces;
said plurality of stub-pairs being dimensioned to fall into sub-groups, each stub-like member in each stub-pair of each sub-group forming an open circuit at the other end thereof and being dimensioned such that each open circuit is transformed into a low impedance in a sub-band of frequencies within said given band, each sub-group having a corresponding sub-band of frequencies, said low impedance paths effectively occurring between said one end of each stub-like member and the corresponding adjacent conductive surface;
each stub-pair in a sub-group providing a low impedance path between said conductive surfaces in the corresponding sub-band of frequencies.

2. The gasket according to claim 1 wherein each stub-like member in each stub-pair has a length from one end to the other of approximately a quarter wavelength at the center frequency of the sub-band of said given band of frequencies corresponding to the sub-group associated with each stub-pair.

3. The gasket according to claim 2 wherein each stub-like member in each stub-pair comprises a conductive strip positioned on one surface of an elongated sheet of dielectric material.

4. The gasket according to claim 3 wherein said means for joining one end of each stub-like member to one end of a corresponding stub-like member comprises a conductive jumper strip positioned on another surface of said sheet of dielectric material and further comprising an electrical connection at said one end of said stub-like member from said jumper through said sheet of dielectric material to said stub-like member.

5. The gasket according to claim 3 wherein said means for joining one end of each stub-like member to one end of a corresponding stub-like member comprises a conductive jumper strip positioned on said one surface of said sheet of dielectric material.

6. The gasket according to claim 5 wherein each stub-pair in a given sub-group is positioned on a separate sheet of dielectric material.

7. The gasket according to claim 6 wherein each sub-group is positioned on a separate sheet of dielectric material and all sheets are positioned adjacent each other and substantially parallel to said conductive surfaces.

8. The gasket according to claim 7 wherein the width of said stub-like members in said stub pairs is related to the distance of a given stub pair from said conductive surfaces.

9. A gasket for providing a plurality of low impedance paths across a given frequency band between two conductive surfaces without establishing a direct current connection between said conductive surfaces, said given frequency band being defined by n sub-bands of frequency where n is a number greater than 1, said gasket comprising:
electrically conductive coupling means for providing n groupings of low-impedance paths between the two electrically discontinuous conductive surfaces, each sub-unit of said electrically conductive coupling means being conductively isolated from said two electrically discontinuous conductive surfaces and providing low impedance paths primarily in a corresponding one of said n sub-bands, each sub-unit of said electrically conductive coupling means comprising a pair of thin elongated conductive members each having a length determined by the sub-band of operation, each member of each pair being conductively connected to the other by a thin, elongated conductive jumper member, each thin elongated conductive member of each pair being positioned in a spaced, substantially parallel relationship with respect to one of said two electrically discontinuous conductive surfaces so as to form a microstrip circuit in relation to said two conductive surfaces.

10. The gasket according to claim 9 wherein each thin elongated conductive member of each pair has a length corresponding to approximately a quarter wavelength at a frequency in one of said n sub-bands.

11. The gasket according to claim 10 wherein each of said elongated conductive members and said corresponding jumper member is attached to a single elongated sheet of dielectric material.

12. The gasket according to claim 10 wherein each sub-unit is formed on a plurality of n separate elongated sheets of dielectric material positioned adjacent to one another.

* * * * *